United States Patent
Swart

(10) Patent No.: US 6,191,601 B1
(45) Date of Patent: Feb. 20, 2001

(54) TEST FIXTURE FOR MATCHED IMPEDANCE TESTING

(75) Inventor: Mark A. Swart, Anaheim Hills, CA (US)

(73) Assignee: Delaware Capital Formation, Inc., Wilmington, DE (US)

(*) Notice: Under 35 U.S.C. 154(b), the term of this patent shall be extended for 0 days.

(21) Appl. No.: 09/255,385

(22) Filed: Feb. 22, 1999

(51) Int. Cl.[7] .................................................. G01R 31/02
(52) U.S. Cl. .............................................. 324/761; 324/754
(58) Field of Search ..................................... 324/761, 754

(56) References Cited

U.S. PATENT DOCUMENTS

| | | |
|---|---|---|
| 4,931,726 | 6/1990 | Kasukabe et al. . |
| 4,975,638 * | 12/1990 | Evans et al. .................... 324/754 |
| 5,663,655 * | 9/1997 | Johnston ......................... 324/761 |
| 5,729,146 * | 3/1998 | Swart .............................. 324/754 |
| 5,818,248 * | 10/1998 | St. Onge ......................... 324/761 |
| 6,005,402 * | 12/1999 | Grasso ............................ 324/754 |

FOREIGN PATENT DOCUMENTS 9113537   5/1997   (JP) .

* cited by examiner

Primary Examiner—Safet Metjahic
Assistant Examiner—J. Kerveros
(74) Attorney, Agent, or Firm—Christie, Parker & Hale, LLP

(57) ABSTRACT

A test fixture for matched impedance testing of a printed circuit board having a top plate for supporting the printed circuit board having matched impedance circuit traces extending from test site locations on the printed circuit board requiring matched impedance testing. Spring probes extend through holes in the top plate for transmission of test signals from the test sites on the printed circuit board to the matched impedance circuit traces. A TDR meter is wired to the top plate by coaxial connectors attached to the circuit traces to read the test signals.

17 Claims, 2 Drawing Sheets

TEST FIXTURE FOR MATCHED IMPEDANCE TESTING

FIELD OF THE INVENTION

This invention relates to the automatic testing of printed circuit boards, and more particularly, to a test fixture for transmission of test signals from a board under test to a tester wherein the test fixture includes a printed circuit board with matched impedance traces as a top plate for testing of high frequency sites on the board under test.

BACKGROUND OF THE INVENTION

Automatic test equipment for checking printed circuit boards has long involved used of a "bed of nails" test fixture in which the circuit board is mounted during testing. This test fixture includes a large number or nail-like spring-loaded test probes arranged to make electrical contact under spring pressure with designated test points on the circuit board under test, also referred to as the unit under test or "UUT." Any particular circuit laid out on a printed circuit board is likely to be different from other circuits, and consequently, the bed of nails arrangement for contacting test points in the board must be customized for that particular circuit board. When the circuit to be tested is designed, a pattern of test points to be used in checking it is selected, and a corresponding array of test probes is configured in the test fixture. This typically involves drilling a pattern of holes in a probe plate to match the customized array of test probes and then mounting the test probes in the drilled holes on the probe plate. The circuit board is then mounted in the fixture superimposed on the array of test probes. During testing, the spring-loaded probes are brought into spring-pressure contact with the test points on the circuit board under test. Electrical test signals are then transferred from the board to the test probes and then to the exterior of the fixture for communication with a high speed electronic test analyzer which detects continuity or lack of continuity between various test points in the circuits on the board.

Various approaches have been used in the past for bringing the test probes and the circuit board under test into pressure contact for testing. One class of these fixtures is a "wired test fixture" in which the test probes are individually wired to separate interface contacts for use in transmitting test signals from the probes to the external electronically controlled test analyzer. These wired test fixtures are often referred to as "vacuum test fixtures" since a vacuum is applied to the interior of the test fixture housing during testing to compress the circuit board into contact with the test probes. Customized wired test fixtures of similar construction also can be made by using mechanical means other than vacuum to apply the spring force necessary for compressing the board into contact with the probes during testing.

The wire-wrapping or other connection of test probes, interface pins and transfer pins for use in a wired test fixture can be time intensive. However, customized wired test fixtures are particularly useful in testing circuit boards with complex arrangements of test points and low-volume production boards where larger and more complex and expensive electronic test analyzers are not practical.

As mentioned previously, the customized wired test fixtures are one class of fixtures for transmitting signals from the fixture to the external circuit tester. A further class of test fixtures is the so-called "dedicated" test fixtures, also known as a "grid-type fixture," in which the random pattern of test points on the board are contacted by translator pins which transfer test signals to interface pins arranged in a grid pattern in a receiver. In these grid-type testers, fixturing is generally less complex and simpler than in the customized wired test fixtures.

A typical dedicated or grid fixture contains test electronics with a huge number of switches connecting test probes in a grid base to corresponding test circuits in the electronic test analyzer. In one embodiment of a grid tester as many as 40,000 switches are used. When testing a bare board on such a tester, a translator fixture supports translator pins that communicate between a grid pattern of test probes in a grid base and off-grid pattern of test points on the board under test. In one prior art grid fixture so-called "tilt pins" are used as the translator pins. The tilt pins are straight solid pins mounted in corresponding pre-drilled holes in translator plates which are part of the translator fixture. The tilt pins can tilt in various orientations to translate separate test signals from the off-grid random pattern of test points on the board to the grid pattern of test probes in the grid base.

In the past, translator fixtures have been constructed and assembled with a plurality of translator plates made from a plastic material such as Lexan. The translator plates are stacked in the fixture between corresponding sets of spacers aligned with one another vertically to form "stand-offs" spaced apart around the periphery of the fixture. The spacers hold the translator plates in a fixed position spaced apart vertically from one another and reasonably parallel to each other. The translator plates at each level of the fixture have pre-drilled patterns of alignment holes that control the position of each tilt pin in the translator fixture.

Testing match impedance test points on a circuit board requires contacting the test points by test probes and analyzing the test signals with a time domain reflectometer. Previous TDR technology consisted of separate hand held probes consisting of a signal probe and a ground probe which were manually operated to contact the desired test locations. When multiple test locations exist for testing, manually testing each site is an inefficient and time consuming task. Consequently, more automated TDR configurations were developed consisting of an x-y prober wherein only one of the prober heads was used and was modified such that the signal wire and the ground shield of the TDR cable extended to the tip of one of the heads of the x-y prober. This single head was designed to be adjustable and rotatable for different test pad spacings. Incorporating a rotatable and adjustable tip on a single prober head is a very expensive and complicated device for testing matched impedance test points. Consequently, a need exists for a TDR test fixture capable of testing matched impedance test points that addresses the problems of the prior art and is easy and inexpensive to manufacture.

SUMMARY OF THE INVENTION

Briefly, one embodiment of this invention comprises a translator fixture for a printed circuit board tester of the type having a pattern of test probes on a base upon which the translator fixture is mounted. The translator fixture comprises a plurality of essentially parallel and vertically spaced apart rigid translator plates having selected patterns of pre-drilled holes for supporting translator pins for contacting test points on a printed circuit board supported on one side of the translator fixture. The translator pins translate electrical test signals between test points on the printed circuit board and the test probes at the base of the tester. The translator fixture includes a plurality of translator plate stacking towers of identical construction for supporting the translator plates in their fixed position in the translator fixture. Each stacking tower comprises a rigid support member formed as an integral piece having vertically spaced apart translator plate support surfaces with corresponding upright alignment posts at spaced apart levels of the stacking tower. The translator plate support surfaces and their corresponding alignment posts having respective diameters at each level which are progressively shorter along the length of the tower to define a stair-step arrangement. The different translator plates are assembled onto the stacking towers at predetermined levels in a progressive stacking sequence, so that each translator plate with its specific pattern of pre-drilled holes is supported by a corresponding translator plate support surface and retained thereon in a fixed position by engagement with the related alignment post.

The top translator plate is a printed circuit board having matched impedance circuit traces extended from locations of high frequency test sites on the unit under test requiring matched impedance testing to coaxial connectors located at the edge of the top translator plate. Spring probes or translator tilt pins extend at least partially through the translator plates within the fixture to contact the high frequency test sites and translate the matched impedance signal through the circuit traces in the top plate to the coaxial connectors. A coaxial cable is attached to the connectors and extends to a TDR meter where the results can be read. Alternatively, the TDR meter can be wired to the test electronics for analysis.

In an alternative embodiment, the printed circuit board top plate with matched impedance circuit traces is incorporated into a wired fixture. In this embodiment, spring probes are wired separately to the test electronics corresponding to test sites not requiring matched impedance testing.

These and other aspects of the invention will be more fully understood by referring to the following detailed description and the accompanying drawings.

DETAILED DESCRIPTION OF THE INVENTION

Figure 1:
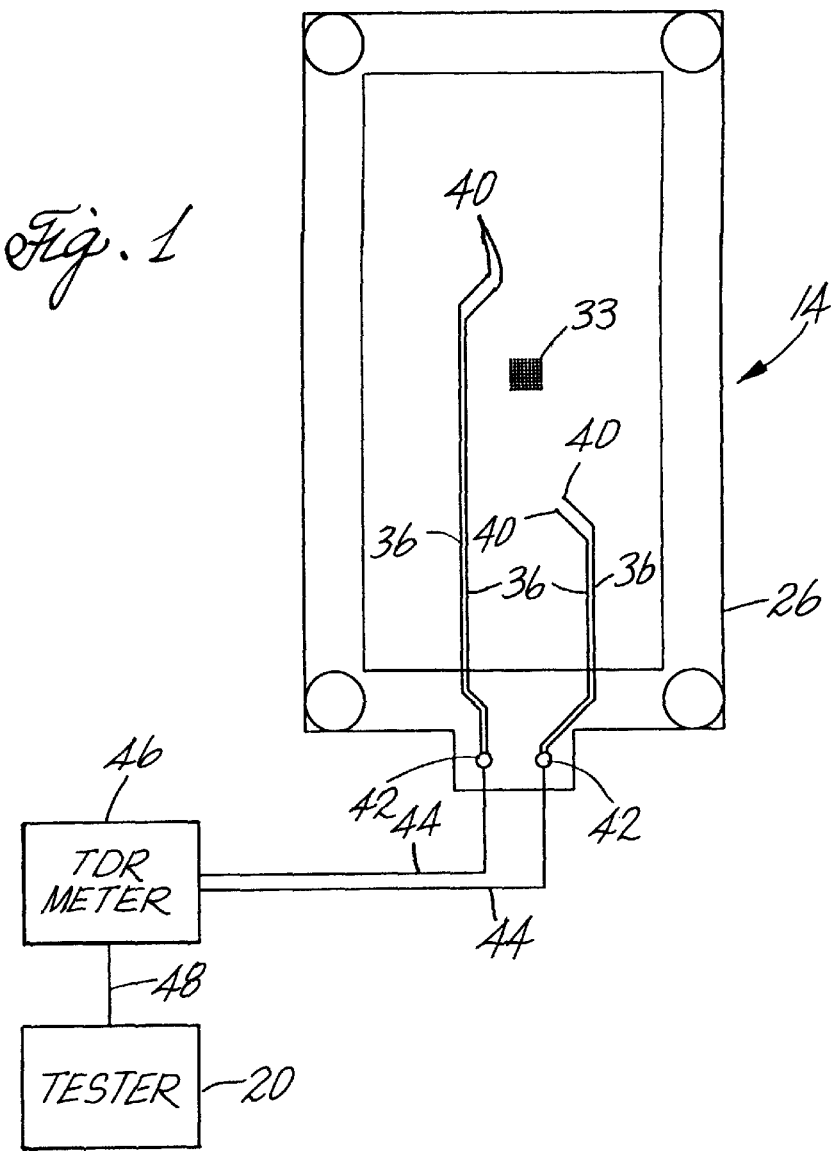
FIG. 1 is a top view of a translator fixture constructed and assembled according to principles of this invention.
Figure 2:
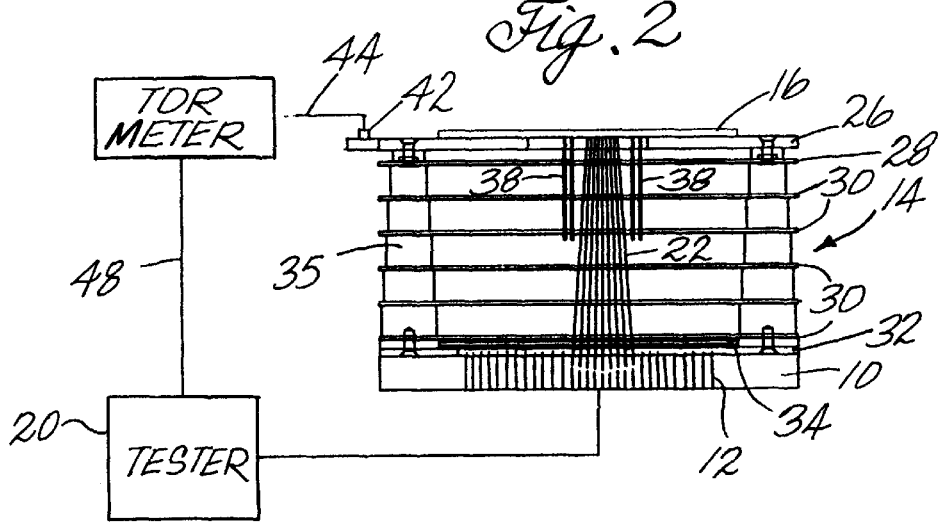
FIG. 2 is a side elevational view of the translator fixture of FIG. 1.

Referring to FIGS. 1 and 2, a grid-type printed circuit board tester includes a grid base 10 having an array of springloaded test probes 12 arranged on a two-dimensional grid pattern. The test probes illustrated schematically in FIG. 1 preferably comprise an orthogonal array of uniformly spaced-apart rows and columns of test probes which may be aligned on 100 mil centers as an example. The spring-loaded plungers of the test probes 12 project above the surface of the grid base uniformly across the array of probes. A test fixture which is a translator fixture 14 supports a printed circuit board 16 under test (also referred to as a "unit under test" or "UUT"). The translator fixture serves as an interface between an array of test sites on the board under test and the test probes 12 in the grid base 10. The test fixture is the subject of this invention and is described in more detail below. An external electronic test analyzer 20 is electrically connected to the test points in the board under test through test probes in the translator fixture. These test probes (of which there can be several types) are illustrated generally at 22.

The test analyzer 20 contains electronic interrogation circuits to electronically interrogate separate test sites of the board under test in order to determine whether or not an electrical connection exists between any two given test points. The electrical connections detected between test sites on the tested board are electronically compared with stored reference results obtained from a previous interrogation of test sites of a faultless master printed circuit board. The tested board is good if test results match the stored reference results, but if any problem exists in the circuits on the board, the problem is detected by the test results and the bad boards then can be separated from the good boards.

Electronic interrogation circuits in one embodiment comprise the plurality of printed circuit cards (sometimes called "switch cars") having electronic components and printed circuits for carrying out the electronic testing. Each test probe used in the test procedure is coupled to the test electronics through a corresponding switch leading to the test analyzer. In a given grid-type tester there can be as many as 40,000 switches available for testing the various test points in a board under test.

The translator fixture 14 includes a series of vertically spaced apart and a parallel translator plates which may include a top plate 26, an upper plate 28 spaced a short distance below the top plate, a series of lower plates 30 at approximately an intermediate level of the translator fixture, and a base plate 32 at the bottom of the translator fixture. The translator plates are supported in parallel vertically spaced apart positions by rigid, integral stair-step posts 35 (also referred to as stacking towers) that hold the fixture together as a rigid unit.

The translator fixture also includes an array of standard translator pins such as tilt pins (represented schematically at 22) extending through the translator plates 26, 28 30 and 32. FIG. 1 illustrates only a few of the standard tilt pins for simplicity. The tilt pins extending through the base plate 32 of the translator fixture are in alignment with the grid pattern of test probes 12 in the grid base 10. The top portions of the tilt pins, which extend through the top plate 26, are in an off-grid pattern aligned to match the random pattern of test sites on the UUT. Thus, the tilt pins can be tilted slightly in various three dimensional orientations used to translate between the grid pattern at the base and the off-grid pattern at the top. The standard tilt pins pass through holes in the base plate, through holes in the lower and upper plates, and through a hole pattern in the top plate. The holes in each of the translator plates (represented by reference numerals 33) are drilled in mostly diagonal patterns and the drill patterns are controlled by standard computer-operated software according to well-known procedures. The translator pins are retained in the fixture by an elastomeric pin retention sheet 34. More specifics of a typical translator fixture is disclosed in U.S. Pat. No. 5,729,146, the disclosure of which is incorporated herein by reference.

The top plate 26 in the translator fixture 14 is a printed circuit board rather than a Lexan plate typically used in conventional translator fixtures. The printed circuit board of the top plate 26 includes matched impedance circuit traces 36 extending through the printed circuit board from test site locations on the unit under test requiring matched impedance testing. Test sites requiring matched impedance testing include high frequency test sites. Spring probes 38 extend through holes 40 in the printed circuit board top plate to transmit the test signals from the test sites to the matched impedance circuit traces 36. Spring probes 38 extend through a number of the translator fixture plates and are retained by a press ring. The circuit traces 36 terminate in coaxial connectors 42 positioned along an edge of the printed circuit board. Coaxial connectors 42 accept coaxial cables 44 which transmit the matched impedance test signals to a TDR meter 46 where the results can be read. A suitable TDR meter is commercially available from Hewlett-Packard or a Techtronics scope. Alternatively, the TDR meter can be connected to the test electronics 20 by cable 48 for further analysis of the matched impedance test signal.

Figure 3:
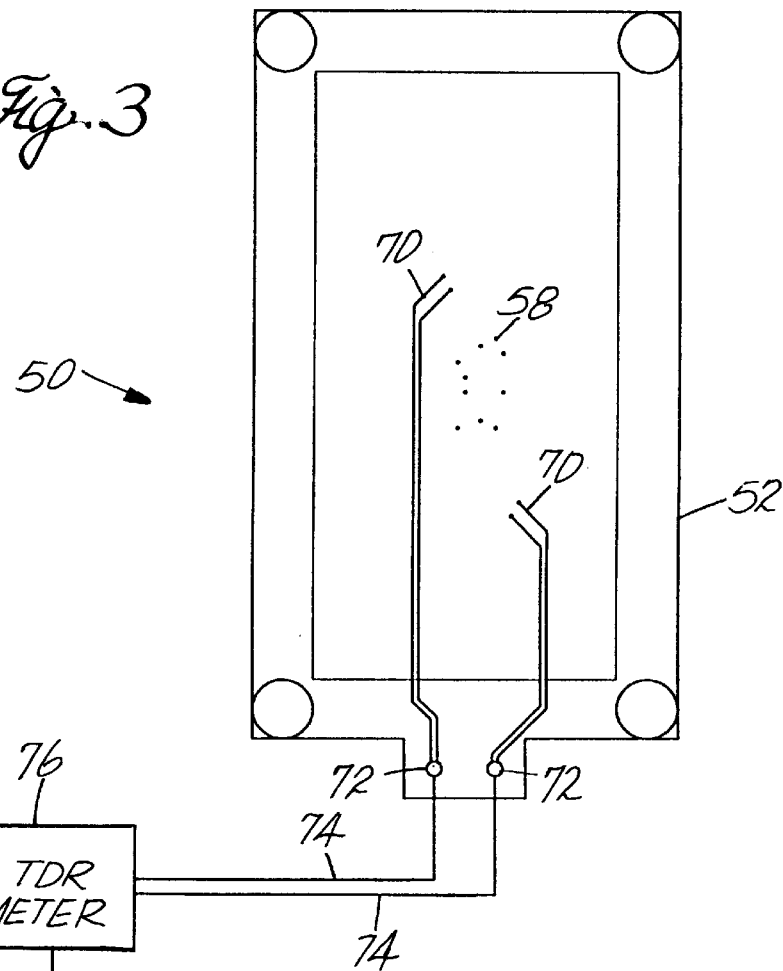
FIG. 3 is a schematic top view of a wired test fixture constructed and assembled according to principles of this invention.
Figure 4:
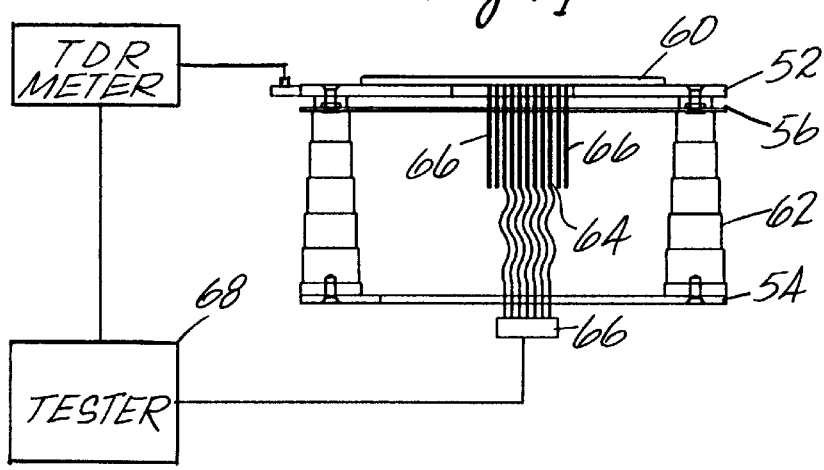
FIG. 4 is a side view of the wired test fixture of FIG. 3.

As shown in FIGS. 3 and 4, an alternative embodiment test fixture 50 is shown. Test fixture 50 is a wired test fixture including a top plate 52, a bottom plate 54 and at least one intermediate plate 56. The intermediate plate 56 and top plate 52 are drilled with a plurality of holes 58 corresponding to the test site location on the unit under test 60 positioned on the upper surface of the top plate 52. The fixture plates are supported in parallel vertically spaced apart by spacers 62.

The wired fixture 50 also includes a plurality of spring probes 64 which are individually wired to a connector 66 for transmission of test signals to the test analyzer 68, as is commonly known in the art. Typically spring probe 64 are rigidly held within the fixture by a press ring in communication with a fixture plate.

As with the test fixture of FIGS. 1 and 2, the top plate 52 is a printed circuit board having routed matched impedance circuit traces 70 corresponding to test site locations on the unit under test requiring matched impedance testing. Spring probes 66 extend through fixture plates 56 and top plate 52 for transmission of the test signals from the matched impedance test sites to the circuit traces 70. Circuit traces 70 terminate in coaxial connectors 72 which receive coaxial cables 74 for transmission of the test signals to the TDR meter 76. Again, TDR meter 76 can be wired to tester 68 by cable 78.

Although the present invention has been described and is illustrated with respect to two preferred embodiments thereof, it is to be understood that the invention is not to be so limited since changes and modifications can be made therein which are within the full intended scope of the invention as hereinafter claimed.

What is claimed is:

1. A test fixture for matched impedance testing of a printed circuit board comprising:

a plurality of fixture plates including a top plate for supporting the printed circuit board having matched impedance circuit traces extending from test site locations on the printed circuit board requiring matched impedance testing;

test probes extending through holes in the top plate for transmission of test signals from the test sites on the printed circuit board requiring matched impedance testing to the matched impedance circuit traces; and means for analyzing the test signals connected to the test fixture.

2. The test fixture of claim 1 wherein the matched impedance circuit traces terminate in coaxial connectors attached to the top plate.

3. The test fixture of claim 2 wherein the means for analyzing the test signals is a TDR meter.

4. The test fixture of claim 3 wherein the TDR meter is connected to the test fixture by a coaxial cable extending between the TDR meter and the coaxial connectors.

5. The test fixture for claim 1 wherein the test probes are spring probes.

6. The test fixture of claim 1 wherein the test fixture is a translator fixture.

7. The test fixture of claim 1 wherein the test fixture is a wired test fixture.

8. A translator fixture for matched impedance testing of a printed circuit board comprising:

a plurality of translator plates including a top plate for supporting the printed circuit board having matched impedance circuit traces extending from test site locations on the printed circuit board requiring matched impedance testing;

a plurality of translator pins extending through the translator plates for contacting test pads on the printed circuit board not requiring matched impedance testing;

a plurality of test probes extending through the top plate for transmission of test signals from matched impedance test sites on the printed circuit board to the matched impedance circuit traces; and means for analyzing the test signals connected to the translator fixture.

9. The translator fixture of claim 8 wherein the matched impedance circuit traces terminate in coaxial connectors located on the top plate.

10. The translator fixture of claim 9 wherein the means for analyzing the test signals is a TDR meter.

11. The translator fixture of claim 10 wherein the TDR meter is connected to the test fixture by coaxial cables extending between the TDR meter and the coaxial connectors.

12. The translator fixture of claim 8 wherein the test probes are spring probes rigidly held within the translator plates.

13. A wired test fixture for matched impedance testing of a printed circuit board comprising:

a plurality of fixture plates including a top plate for supporting the printed circuit board having matched impedance circuit traces extending from test site locations on the printed circuit board requiring matched impedance testing;

a plurality of spring probes contained within the test fixture separately wired to external test electronics;

a plurality of test probes extending through holes in the top plate for transmission of test signals from the test sites on the printed circuit board to the matched impedance circuit traces; and means for analyzing the matched impedance test signals wired to the matched impedance circuit traces.

14. The wired test fixture of claim 13 wherein the matched impedance circuit traces terminate in coaxial connectors attached to the top plate.

15. The wired test fixture of claim 14 wherein the means for analyzing the test signals is a TDR meter.

16. The wired test fixture of claim 15 wherein the TDR meter is connected to the matched impedance circuit traces by a coaxial cable extending between the TDR meter and the coaxial connectors.

17. The wired test fixture of claim 13 wherein the test probes are spring probes.

* * * * *